(12) United States Patent
Lee

(10) Patent No.: US 6,262,917 B1
(45) Date of Patent: Jul. 17, 2001

(54) STRUCTURE OF A FLASH MEMORY DEVICE

(75) Inventor: Chien-Hsing Lee, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/534,668

(22) Filed: Mar. 24, 2000

(30) Foreign Application Priority Data

Oct. 22, 1999 (TW) .................................................. 88118300

(51) Int. Cl.[7] .................................................. H01L 29/788
(52) U.S. Cl. .................................. 365/185.33; 365/185.14; 365/185.01; 257/315; 257/316; 257/382
(58) Field of Search .................................. 365/185.01, 189.01, 365/185.14, 185.33; 257/314, 315, 316, 382

(56) References Cited

U.S. PATENT DOCUMENTS

| 5,411,905 | * | 5/1995 | Acovic et al. | 437/43 |
| 5,495,441 | * | 2/1996 | Hong | 365/185.01 |
| 5,640,031 | * | 6/1997 | Keshtbod | 257/315 |
| 5,970,341 | * | 10/1999 | Lin et al. | 438/257 |
| 5,990,515 | * | 11/1999 | Liu et al. | 257/316 |
| 6,066,880 | * | 5/2000 | Kusunoki | 257/379 |
| 6,078,076 | * | 6/2000 | Lin et al. | 257/321 |

\* cited by examiner

Primary Examiner—Viet Q. Nguyen
(74) Attorney, Agent, or Firm—Thomas, Kayden, Horstemeyer & Risley, LLP

(57) ABSTRACT

A flash memory device is described. A gate oxide layer is situated on a substrate next to a trench and a floating gate is located on the gate oxide layer. A source region is located in the substrate at the bottom of the trench and a drain region is located on a side of the floating gate. A dielectric layer is on the floating gate, the gate oxide layer and the trench. A control gate is located on the dielectric layer.

5 Claims, 3 Drawing Sheets

STRUCTURE OF A FLASH MEMORY DEVICE

CROSS-REFERENCE TO RELATED APPLICATION

This application claims the priority benefit of Taiwan application serial no. 88118300, filed Oct. 22, 1999.

BACKGROUND OF THE INVENTION

1. Field of the Invention

The present invention relates to a structure of a flash memory device. More particularly, the present invention relates to a structure of a split-gate flash memory device.

2. Description of the Related Art

In general, the conventional structure of an erasable programmable read-only memory (EPROM) device is similar to that of the N-type metal-oxide-semiconductor (MOS), wherein the gate structure is the stacked gate type, comprising a polysilicon floating gate for charge storage and a control gate to control the storage and retrieval of information. Thus a typical EPROM unit comprises two gates, a floating gate and the underlying control gate. The control gate is connected to the word line, while the floating gate is maintained in a "floating" condition and has no connection with the external circuits. At present, the most popular type of flash memory device has been developed by Intel Corporation, in which the erasure operation can be conducted "block by block", and the erasure speed is fast. The erasure operation is completed in 1 to 2 seconds, greatly reducing the time and the cost of operation. The traditional stacked gate structure of the flash memory device, wherein the floating gate and the control gate are stacked on each other, often result in the problem of an over-erasure during the flash-memory device erasure operation.

To resolve the over-erasure problem in the traditional stacked gate structure of a flash memory device, a split gate flash memory device is being developed.

FIG. 1 is a schematic, cross-sectional view of a split-gate flash-memory device according to the prior art. The structure of the split-gate flash memory device includes a substrate 100, comprising a source region 102a and a drain region 102b. On the substrate 100 is a gate oxide layer 104, wherein a floating gate 106, a dielectric layer 108 and a control gate 110 are on the gate oxide layer 104.

The operation conditions of a conventional split-gate flash-memory device are summarized in Table 1.

TABLE 1

Operation Conditions of a Conventional Split-Gate Flash-Memory Device.

| Operations | Control Gate | Bit Line (Drain Region) | Source Region | Substrate |
| --- | --- | --- | --- | --- |
| Programming | 8–12 V | 3–8 V | GND | GND |
| Erasure | GND | GND | GND | >15 V |
| Reading | Vcc | 1–2 V | GND | GND |

In a split gate flash memory device, the control gate 110 and the floating gate 106 are not completely stacked on each other, the problem of an excessive erasure as in the conventional stacked gate is thereby obviated. As the device dimensions are continuously being reduced, the distance between the source region 102a and the drain region 102b, however, also decreases. A short channel between the source region 102a and the drain region 102b is results, easily leading to the punch through effect. The dimensions of a split-gate flash-memory device, as a result, cannot be scaled-down.

SUMMARY OF THE INVENTION

Based on the foregoing, the present version of the current invention provides a structure of a flash memory device, which includes a substrate, a gate oxide layer, a floating gate, a source region, a drain region, a dielectric layer and a control gate, wherein the substrate comprises a trench. The gate oxide layer is situated on the substrate next to the trench and the floating gate is located on the gate oxide layer. The source region is located in the substrate at the bottom of the trench and the drain region is located on a side of the floating gate. The dielectric layer on the substrate conformally covers the floating gate, the gate oxide layer and the trench. A control gate is also located on the dielectric layer. Additionally, the trench is about 0.1 micron to 1 micron deep. The source region formed at the bottom of the trenches in the substrate, the floating gate, the drain region and another floating gate form an alternating structure.

Since the depth of the trench is about equal to the channel length of the split gate transistor, the channel length of the split gate transistor will not be affected by the shrinkage of the device dimensions because the source region is located deep in the substrate at the bottom of the trench. The punch through effect due to a reduction of the device dimension in the conventional practice is thus prevented.

Furthermore, the source region and the drain region are formed in the substrate after the formation of the floating gate; the fabrication of the floating gate thus has a greater processing window.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENT

FIGS. 2A to 2F are schematic, cross-sectional views of a flash memory device according to the present invention. FIG. 2G is a cross-sectional view of FIG. 2F along the dash line I—I.

Figure 1:
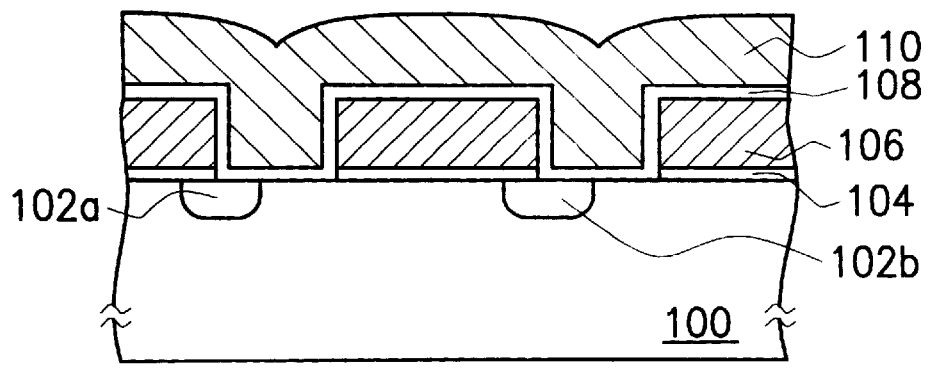
FIG. 1 is a schematic, cross-sectional view of a split-gate flash memory device according to the prior art.
Figure 2A:
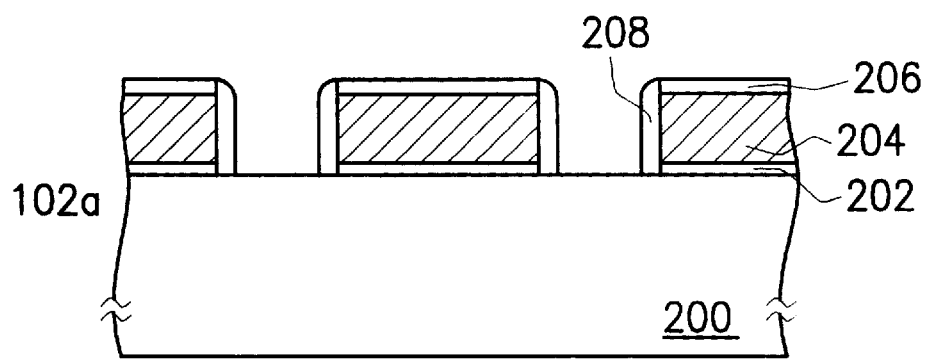
FIGS. 2A to 2F are schematic, cross-sectional views of a flash memory device according to the present invention.

Referring to FIG. 2A, a gate structure, which comprises a gate oxide layer 202, a floating gate 204, a cap layer 206 and a spacer 208, is formed on the substrate 200. The gate structure is formed by, for example, sequentially forming a dielectric layer (not shown), a conductive layer (not shown) and a dielectric layer (not shown). Photolithography and etching are then conducted to define the dielectric layer, the conductive layer and the dielectric layer to form, respectively, a gate oxide layer 202, a floating gate 204 and a cap layer 206. A dielectric layer is further formed on the substrate 200, followed by performing an etching process, for example, anisotropic etching until the cap layer 206 and the surface of the substrate 200 are exposed to form a spacer 208 on the sidewalls of the gate oxide layer 202, the floating gate 204 and the cap layer 206. The floating gate 204 is, for example, polysilicon. The cap layer is, for example, silicon nitride or silicon oxide, and the spacer 208 is, for example, silicon oxide.

Figure 2B:
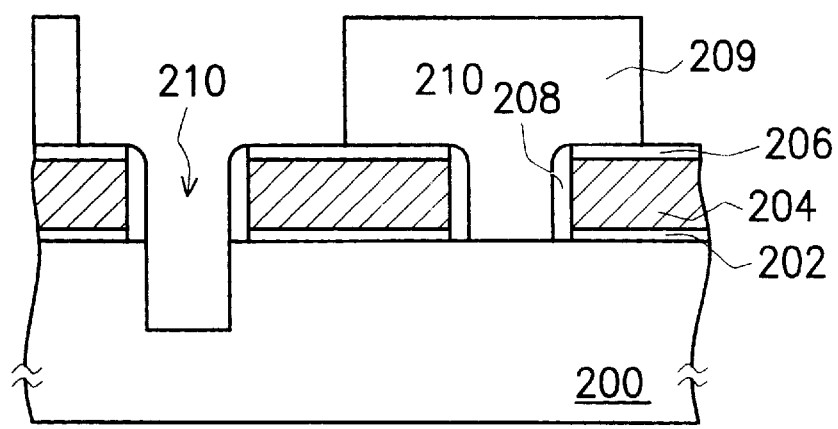

As shown in FIG. 2B, a patterned photoresist layer 209 is formed on the substrate 200. The patterned photoresist layer 209 exposes a substrate 200 surface on one side of the gate structure. A trench 210 is then formed on the exposed substrate 200 on one side of the gate structure. The trench 210 is formed by, for example, conducting anisotropic etching on the substrate 200 while using a patterned photoresist 209, cap layer 206 and spacer 208 as masks. In other words, the trench 210 is formed on one side of the gate and is formed in the space between the gate structures. Furthermore, the trench 210 is about 0.1 micron to 1 micron deep, and the depth of the trench 210 is about equal to the channel length of the subsequently formed split gate transistor (which transistor is formed with the split type control gate, a split type gate dielectric layer and the substrate).

Figure 2C:
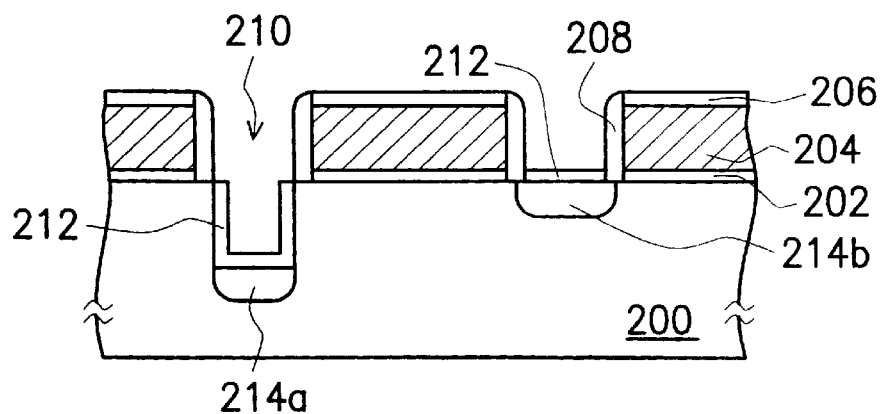

After this, as shown in FIG. 2C, the photoresist 209 (as in FIG. 2B) is removed, followed by conducting a self-aligned oxidation process to form a dielectric layer 212 on the exposed substrate 200 surface of the trench 210, wherein the dielectric layer 212 is, for example, silicon oxide.

Using the cap layer 206 and the spacer 208 as masks, an ion implantation is conducted to form a source region 214a in the substrate 200 at the bottom of the trench 210 under a part of the dielectric layer 212. A drain region 214b is concurrently formed between the gate structures in the substrate 200 under the dielectric layer 212. Consequently, an alternating structure is formed with the source region 214a in the substrate at the bottom of the trench 210, the gate structure, the drain region 214b and another gate structure.

The ion implantation is accomplished by doping ions vertically into the surface of the substrate 200. The doping energy is about 20 KeV to about 100 KeV. If the implanted dopant is arsenic or phosphorous, the implanted dosage is about $5 \times 10^{14}$ atoms/cm$^2$ to about $1.0 \times 10^{16}$ atoms/cm$^2$. Furthermore, the source region 214a also serves as a buried bit line.

After this, a threshold voltage adjustment implantation is conducted, in which the dopant is implanted at a tilted angle into the substrate 200. If the dopants for the source region 214a and the drain region 214b are boron ions, the doping energy is about 50 KeV and the dosage is about $1 \times 10^{12}$ atoms/cm$^2$ to about $5 \times 10^{13}$ atoms/cm$^2$. Since a dielectric layer 212 is formed on the surface of the substrate 210 that is not covered by the gate structures, the exposed substrate 200 in the trenches 210 is prevented from being damaged during ion implantation of the source region 214a and the drain region 214b and the threshold voltage adjustment implantation.

Figure 2D:
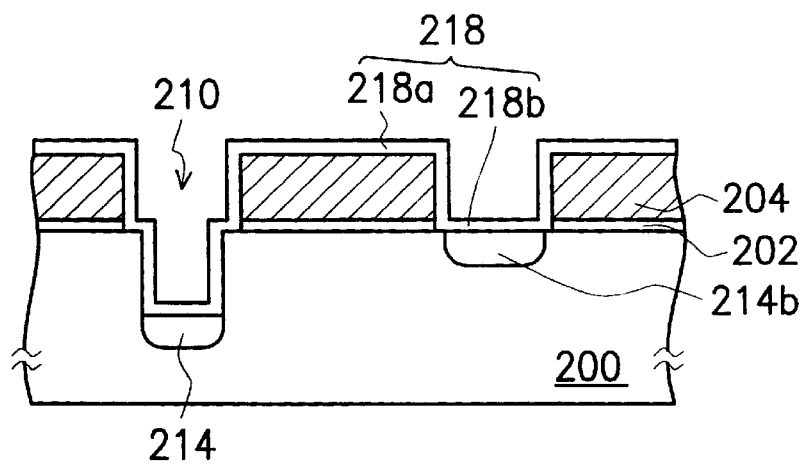

Continuing to FIG. 2D, the spacer 208, the dielectric layer 212 and the cap layer 206 are removed. When the spacer 208, the dielectric layer 212 and the cap layer are silicon oxide, wet etching is conducted using, for example, an etchant solution containing hydrogen fluoride (HF) to remove these structures. On the other hand, when the spacer 208, the dielectric layer 212 and the cap layer 206 are silicon nitride, wet etching is conducted using, for example, hot phosphoric acid as an etchant.

After this, a conformal dielectric layer 218 is formed on the substrate 200. The dielectric layer 218 includes the inner polysilicon dielectric layer 218a on the top surface and the sidewalls of the floating gate 204, and the split gate dielectric layer 218b on the exposed part of the substrate 200 surface not covered by the floating gates 204. The inner polysilicon dielectric layer 218a and the split gate dielectric layer 218b can form concurrently or separately and they can be of different materials. The inner polysilicon dielectric layer 218a is, for example, a silicon oxide-silicon nitride-silicon oxide layer; and the split gate dielectric layer 218b is, for example, polysilicon.

Figure 2E:
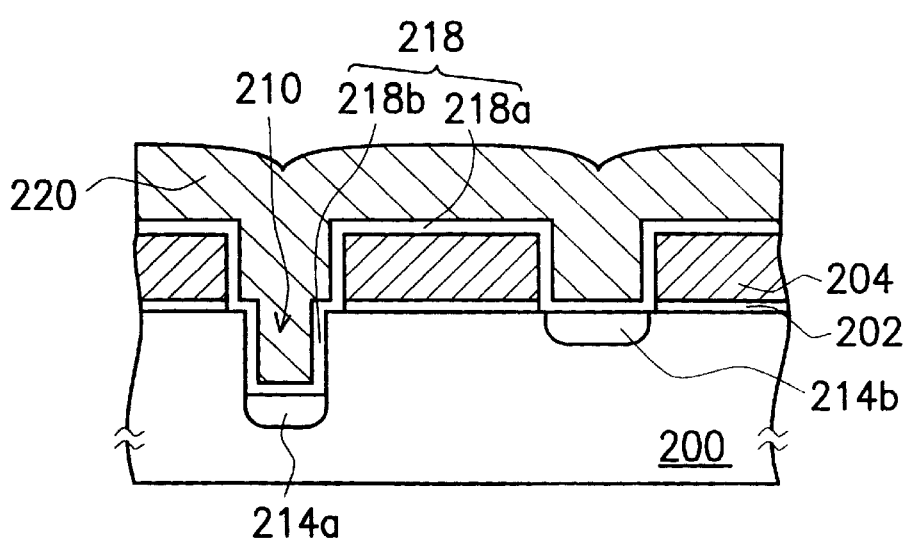

Continuing to FIG. 2E, a conductive layer 220 is formed on the substrate 200, filling the trenches 210 and the space between the floating gates.

Figure 2F:
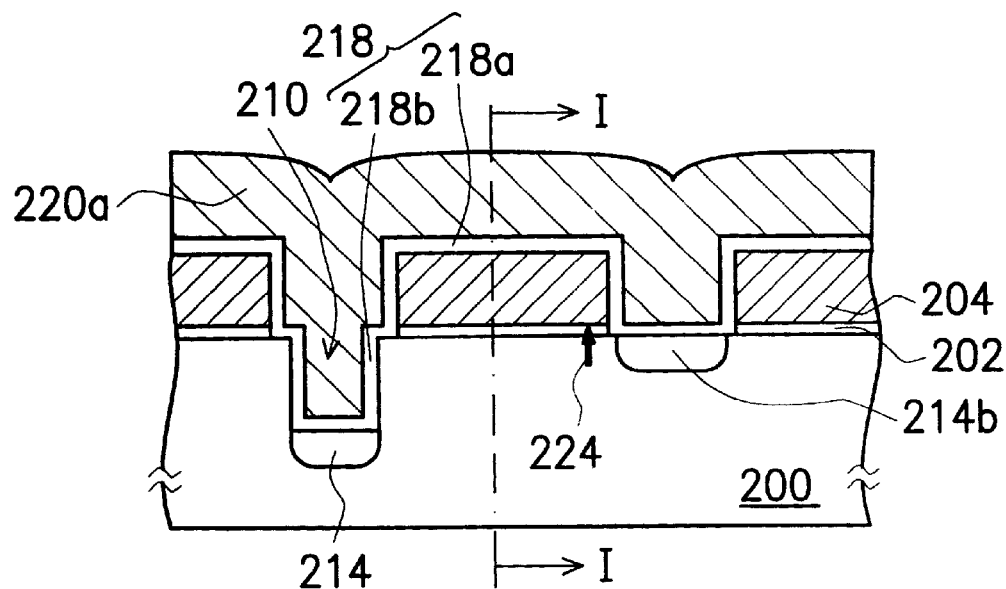
Figure 2G:
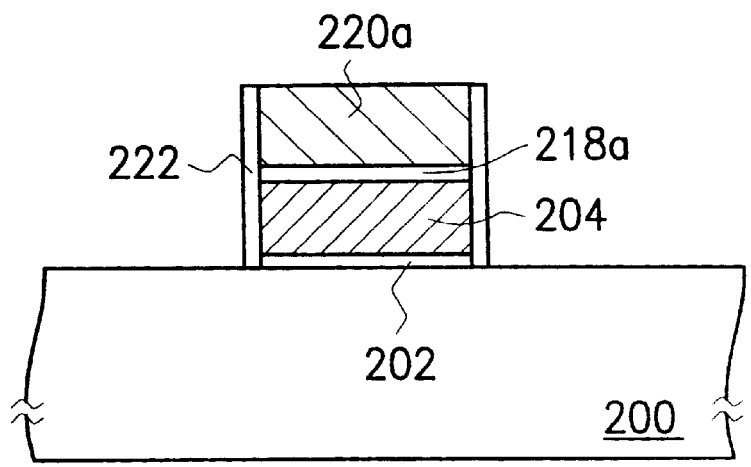
FIG. 2G is a cross-sectional view of FIG. 2F along the line I—I.

Referring to FIGS. 2F and 2G, the conductive layer 220 (as in FIG. 2E), the dielectric layer 218, and the floating gate 204 are defined, converting the conductive layer 220 into a control gate 220a. Thereafter, a dielectric layer 222 is formed on the sidewalls of the control gate 220a, the inner polysilicon dielectric layer 218a and the floating gate 204, sealing the floating gate 204 and electrically isolating the floating gate 204. The fabrication of a split-gate flash memory device is thus completed, wherein the split gate transistor is formed with a portion of the control gate 220a above the trench 210, the split gate dielectric layer 218b and the substrate 200.

The operating voltage conditions of the split-gate flash memory device formed according to the preferred embodiment of the present invention is summarized in Table 2.

TABLE 2

The Operating Voltages for the Split-Gate Flash Memory Device Formed According to the Preferred Embodiment of the Present Invention.

| Operations | Control Gate | Bit Line (Drain Region) | Source Region | Substrate |
|---|---|---|---|---|
| Programming | 1–10 V | 3–8V | GND | GND |
| Erasure | GND | GND | GND | >15 V |
| Reading | Vcc | 1–2 V | GND | GND |

Before the performance of the programming operation, the flash memory cell is over-erased and many positive charges are stored in the floating gate 204. During the programming operation, the split gate transistor is opened and hot electrons travel from the source region 214a along the border of the source region 214a. Near the border of the drain region 214b, the hot electrons penetrate vertically through the gate oxide layer 202 at the hot electron injection point indicated by the arrow 224 and inject into the floating gate 204.

Since the source/drain regions and the corresponding floating gate 204 form a symmetrical structure, the probability for hot electrons to travel from the two source/drain regions 214 into the floating gate is equal. As a results, two high electric field of the channel gaps between the control gate 220a overlying the trenches 210 and the floating gate 204 are provided, resulting in two high hot electron injection points, as indicated by arrows 224a and 224b, formed under the floating gate 204. Consequently, the flash memory device formed according to the present invention provides a lower programming current consumption, a higher electron injection efficiency and an improved operating speed.

Furthermore, when compared to the flash memory device of the conventional practice, the programming operation of the flash memory device formed according to the present invention requires a lower operation voltage at the control gate, which is appropriate for programming operations of 2.5 V and below.

Since the depth of the trench 210 is related to and is about equal to the channel length of the split gate transistor, the channel length of the split gate transistor is thereby not affected by the reduction of the device dimension, even when the integration of a device increases and the dimension of the device decreases. The punch through effect between the source region 214a and the drain region 214b is thus prevented. In addition, during the programming operation with the flash memory device formed according to the preferred embodiment of the present invention, a lower control gate voltage is required, which is appropriate for a programming operation of 2.5 V and below.

According to the preferred embodiment of the present invention, the formation of the source region 214a and the drain region 214b in the exposed substrate 200 at the bottom of the trenches 210 is completed after the formation of the trenches 210 in the exposed substrate 200. The step of forming the trenches 210, in turns, is follows the formation of the gate oxide layer 202, the floating gate 204, the cap layer 206 and the spacer 208. Compared to the conventional practice in which the source region 214a and the drain region 214b are formed in the substrate 200 before the formation of the floating gate, the fabrication method of the present invention provides a larger processing window and a higher alignment accuracy.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A flash memory device comprising:
    a substrate, and the substrate comprises a trench formed in the substrate;
    a gate oxide layer, wherein the gate oxide layer is located on the substrate on a side of the trench;
    a floating gate, wherein the floating gate is located on the gate oxide layer;
    a source region, wherein the source region is located in the substrate at a bottom of the trench;
    a drain region, wherein the drain region is located on one side of the floating gate in a part of the substrate where the trench is not formed;
    a dielectric layer, wherein the dielectric layer is located on the substrate and the dielectric layer is conformal to the floating gate, the gate oxide layer and the trenches, wherein the dielectric layer directly contacts a top surface of the floating gate; and
    a control gate, wherein the control gate is located on the dielectric layer.

2. The flash memory device according to claim 1, wherein the trench is about 0.1 micron to 1 micron deep.

3. The flash memory device according to claim 1, wherein the floating gate includes polysilicon.

4. The flash memory device according to claim 1, wherein the control gate includes polysilicon.

5. The flash memory device according to claim 1, wherein the source region located at the bottom of the trench in the substrate, the floating gate, the drain region and the gate form an alternating structure.

* * * * *